(12) United States Patent
Wang et al.

(10) Patent No.: US 10,757,654 B2
(45) Date of Patent: Aug. 25, 2020

(54) COMMUNICATION METHOD AND MOBILE TERMINAL

(71) Applicant: HUAWEI TECHNOLOGIES CO., LTD., Shenzhen (CN)

(72) Inventors: Yajun Wang, Xi'an (CN); Zhongying Long, Shenzhen (CN); Chonglu Chen, Shenzhen (CN); Guangsheng Pan, Shenzhen (CN); Heping Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/462,943

(22) PCT Filed: Feb. 22, 2017

(86) PCT No.: PCT/CN2017/074431
§ 371 (c)(1),
(2) Date: May 22, 2019

(87) PCT Pub. No.: WO2018/152709
PCT Pub. Date: Aug. 30, 2018

(65) Prior Publication Data
US 2019/0327684 A1 Oct. 24, 2019

(51) Int. Cl.
*H04B 1/04* (2006.01)
*H04W 52/02* (2009.01)
(Continued)

(52) U.S. Cl.
CPC ...... *H04W 52/0274* (2013.01); *H04B 1/0475* (2013.01); *H04B 17/318* (2015.01);
(Continued)

(58) Field of Classification Search
CPC ............... H04W 4/80; H04W 52/0274; H04W 52/0229; H04W 52/246; H04B 1/04;
(Continued)

(56) References Cited

U.S. PATENT DOCUMENTS 7,623,896 B2 * 11/2009 Tanaka ................. H03G 1/0088
455/572
2002/0021244 A1 2/2002 Aizawa et al.
(Continued)

FOREIGN PATENT DOCUMENTS

CN 1929198 A 3/2007
CN 201418108 Y 3/2010
(Continued)

*Primary Examiner* — Tuan Pham
(74) *Attorney, Agent, or Firm* — Kilpatrick Townsend & Stockton LLP

(57) ABSTRACT

The communication method includes: obtaining a received signal strength indicator RSSI; comparing the obtained RSSI with a predetermined value; determining a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module; and transmitting a Bluetooth signal based on the determined Bluetooth transmission link. According to the present invention, the RSSI value of the Bluetooth device is detected, the detected RSSI value is compared with the predetermined value, and the transmission link of the Bluetooth device is determined based on the comparison result.

8 Claims, 7 Drawing Sheets

(51) Int. Cl.
*H04B 17/318* (2015.01)
*H04W 4/80* (2018.01)

(52) U.S. Cl.
CPC ......... *H04W 4/80* (2018.02); *H04W 52/0229* (2013.01); *H04B 2001/045* (2013.01)

(58) Field of Classification Search
CPC .... H04B 2001/0408; H04B 2001/0416; H04B 17/318; H03F 3/20
See application file for complete search history.

(56) References Cited

U.S. PATENT DOCUMENTS

| | | | | |
|---|---|---|---|---|
| 2004/0203403 | A1* | 10/2004 | Cutcher | H03G 3/3052 455/63.1 |
| 2005/0272457 | A1* | 12/2005 | Nichols | H04W 52/245 455/522 |
| 2007/0052599 | A1 | 3/2007 | Shimizu et al. | |
| 2010/0008338 | A1* | 1/2010 | Tsfati | H04B 1/006 370/338 |
| 2012/0236958 | A1 | 9/2012 | Deng et al. | |
| 2016/0374002 | A1 | 12/2016 | Tuluca | |
| 2016/0374028 | A1* | 12/2016 | Narang | H04W 52/20 |
| 2017/0164172 | A1 | 6/2017 | Kodama | |

FOREIGN PATENT DOCUMENTS

| | | | | |
|---|---|---|---|---|
| CN | 102047567 A | | 5/2011 | |
| CN | 105337049 A | | 2/2016 | |
| CN | 205039804 U | | 2/2016 | |
| EP | 3104588 A1 | | 12/2016 | |
| JP | H06350477 A | * | 12/1994 | ............... H04B 1/38 |
| JP | H06350477 A | | 12/1994 | |
| JP | 2012213180 A | * | 11/2012 | ............... H04B 1/04 |
| JP | 2012213180 A | | 11/2012 | |
| KR | 20070099226 A | | 10/2007 | |
| KR | 20100067294 A | * | 6/2010 | ............... H04B 1/18 |
| WO | 2015118753 A1 | | 8/2015 | |

* cited by examiner

COMMUNICATION METHOD AND MOBILE TERMINAL

CROSS-REFERENCE TO RELATED APPLICATIONS

This application is a national stage of International Application No. PCT/CN2017/074431, filed on Feb. 22, 2017, which is hereby in cooperated by reference in its entirety.

TECHNICAL FIELD

The present invention relates to the communications field, and in particular, to a communication method for a Bluetooth device and a related Bluetooth device.

BACKGROUND

With development of science and technologies, an increasing quantity of Bluetooth products appear in people's life. FIG. 1A and FIG. 1B are diagrams of common usage scenarios of a Bluetooth device. FIG. 2 shows a front-end solution of a current mainstream Wi-Fi/BT (Bluetooth, Bluetooth) two-in-one module. It can be learned from the figure that a SAW (surface acoustic wave, surface acoustic wave) component is added to a frontend of a BT chip in actual use of a product in consideration of interference elimination. An SPDT (Single-pole Double-Throw, single-pole double-throw) switch used for transmission/reception switching is further disposed inside the module. Due to a wiring loss of a circuit board, actually, transmit power from an IPA (internal Power Amplifier, internal power amplifier) of a Bluetooth function module is reduced when arriving at an antenna port of a terminal product, resulting in a decrease in a Bluetooth communication distance. Currently, transmit power of a BT chip is approximately 10 dBm, and transmit power of some BT chips may reach 13 dBm to 14 dBm. When a requirement of a BT transmit power standard is satisfied, to increase a BT communication distance, BT transmit power of the antenna port of the terminal product needs to be increased as much as possible. FIG. 3A is a schematic diagram of a Wi-Fi/BT two-in-one module working in a Wi-Fi mode or in a BT reception mode in the prior art. FIG. 3B shows a solution for increasing BT transmit power of an antenna port in the prior art. Specifically, an external PA (Power Amplifier, power amplifier), namely, an EPA (External Power Amplifier, external power amplifier), is added outside a BT chip, thereby increasing transmit power of an antenna port of a product and increasing a communication distance. According to the solution shown in FIG. 3B, maximum Bluetooth transmit power is implemented by cascading an EPA and an IPA. The IPA serves as input of the EPA and provides an excitation signal for the EPA. Transmit power output by the EPA is Bluetooth transmit power. According to the foregoing solution, BT transmit power is effectively increased. However, in this solution, because the IPA and the EPA work together, power consumption of a system is increased. As a result, working time of a product is decreased. In addition, if transmit power of the IPA is relatively high, output power of the EPA is to be saturated, resulting in a product transmission indicator exception, and affecting communication quality.

SUMMARY

Embodiments of the present invention describe a communication method for a Bluetooth device and a Bluetooth device, to effectively increase Bluetooth transmit power and reduce power consumption for transmission.

According to one aspect, an embodiment of the present invention provides a communication method for a Bluetooth device. The method includes: obtaining a received signal strength indicator RSSI, and comparing the obtained RSSI with a predetermined value; determining a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module; and transmitting a Bluetooth signal based on the determined Bluetooth transmission link. According to the solution provided in this embodiment, the Bluetooth device may adjust the Bluetooth transmission link based on actual signal strength, thereby effectively increasing Bluetooth transmit power while reducing power consumption for transmission.

In a possible case, the predetermined value includes a first threshold and a second threshold, where the determining a Bluetooth transmission link based on a comparison result specifically includes: if the RSSI is greater than the first threshold, determining that the Bluetooth transmission link is the first transmission link; or if the RSSI is less than the second threshold, determining that the Bluetooth transmission link is the second transmission link. According to the solution provided in this embodiment, the Bluetooth device may select a link of the internal power amplifier or a link of a combination of the internal power amplifier and the external power amplifier based on actual signal strength, thereby effectively increasing Bluetooth transmit power while reducing power consumption for transmission.

In a possible case, the Bluetooth device includes a power control table, where the power control table includes a high gain class and a low gain class; when it is determined that the Bluetooth transmission link is the first transmission link, the power control table is adjusted to the high gain class; and when it is determined that the Bluetooth transmission link is the second transmission link, the power control table is adjusted to the low gain class. According to the solution provided in this embodiment, overflow and excessively low power caused by excessively high Bluetooth transmit power can be effectively prevented by adjusting the power control table.

In a possible case, the Bluetooth device is a secondary Bluetooth device, and the obtaining a received signal strength indicator RSSI is specifically: receiving, by the secondary Bluetooth device, an RSSI, detected by a primary Bluetooth device, of the secondary Bluetooth device. According to the solution provided in this embodiment, the secondary Bluetooth device does not need to detect the RSSI of the secondary Bluetooth device, thereby simplifying a structure of the secondary Bluetooth device, and reducing costs of the secondary Bluetooth device.

In a possible case, the Bluetooth device is a primary Bluetooth device, the obtaining a received signal strength indicator RSSI is: obtaining, by the primary Bluetooth device, an RSSI of a secondary Bluetooth device, and the determining a Bluetooth transmission link based on a comparison result is: determining, by the primary Bluetooth device, the Bluetooth transmission link based on the comparison result. According to the solution provided in this embodiment, the primary Bluetooth device can adjust transmit power of the primary Bluetooth device based on signal strength of the secondary device.

According to another aspect, an embodiment of the present invention provides a Bluetooth device. The Bluetooth device includes an obtaining unit, a processing unit, and a signal transmission unit. The obtaining unit is configured to obtain a received signal strength indicator RSSI. The processing unit is configured to compare the obtained RSSI with a predetermined value, and determine a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module. The signal transmission unit is configured to transmit a Bluetooth signal based on the Bluetooth transmission link determined by the processing unit. According to the solution provided in this embodiment, the Bluetooth device may adjust the Bluetooth transmission link based on actual signal strength, thereby effectively increasing Bluetooth transmit power while reducing power consumption for transmission.

In a possible case, the predetermined value includes a first threshold and a second threshold, and the determining a Bluetooth transmission link based on a comparison result specifically includes: if the RSSI is greater than the first threshold, the processing unit determines that the Bluetooth transmission link is the first transmission link; or if the RSSI is less than the second threshold, the processing unit determines that the Bluetooth transmission link is the second transmission link. According to the solution provided in this embodiment, the Bluetooth device may select a link of the internal power amplifier or a link of a combination of the internal power amplifier and the external power amplifier based on actual signal strength, thereby effectively increasing Bluetooth transmit power while reducing power consumption for transmission.

In a possible case, the Bluetooth device includes a power control table, where the power control table includes a high gain class and a low gain class; when determining that the Bluetooth transmission link is the first transmission link, the processing unit adjusts the power control table to the high gain class; and when determining that the Bluetooth transmission link is the second transmission link, the processing unit adjusts the power control table to the low gain class. According to the solution provided in this embodiment, overflow and excessively low power caused by excessively high Bluetooth transmit power can be effectively prevented by adjusting the power control table.

In a possible case, the Bluetooth device is a secondary Bluetooth device. The secondary Bluetooth device includes a receiving unit, configured to receive, from the secondary Bluetooth device, an RSSI, detected by a primary Bluetooth device, of the secondary Bluetooth device. According to the solution provided in this embodiment, the secondary Bluetooth device does not need to detect the RSSI of the secondary Bluetooth device, thereby simplifying a structure of the secondary Bluetooth device, and reducing costs of the secondary Bluetooth device.

In a possible case, the Bluetooth device is a primary Bluetooth device, the obtaining a received signal strength indicator RSSI is: obtaining, by the primary Bluetooth device, an RSSI of a secondary Bluetooth device, and the determining a Bluetooth transmission link based on a comparison result is: determining, by the primary Bluetooth device, the Bluetooth transmission link based on the comparison result. According to the solution provided in this embodiment, the primary Bluetooth device can adjust transmit power of the primary Bluetooth device based on signal strength of the secondary device.

According to another aspect, an embodiment of the present invention provides a Bluetooth device. The Bluetooth device includes a receiver, a processor, and a transmitter. The receiver is configured to obtain a received signal strength indicator RSSI. The processor is configured to compare the obtained RSSI with a predetermined value, and determine a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module. The transmitter is configured to transmit a Bluetooth signal based on the Bluetooth transmission link determined by the processing unit. According to the solution provided in this embodiment, the Bluetooth device may adjust the Bluetooth transmission link based on actual signal strength, thereby effectively increasing Bluetooth transmit power while reducing power consumption for transmission.

In a possible case, the predetermined value includes a first threshold and a second threshold, and the determining a Bluetooth transmission link based on a comparison result specifically includes: if the RSSI is greater than the first threshold, the processor determines that the Bluetooth transmission link is the first transmission link; or if the RSSI is less than the second threshold, the processor determines that the Bluetooth transmission link is the second transmission link. According to the solution provided in this embodiment, the Bluetooth device may select a link of the internal power amplifier or a link of a combination of the internal power amplifier and the external power amplifier based on actual signal strength, thereby effectively increasing Bluetooth transmit power while reducing power consumption for transmission.

In a possible case, the Bluetooth device includes a power control table, where the power control table includes a high gain class and a low gain class; when determining that the Bluetooth transmission link is the first transmission link, the processor adjusts the power control table to the high gain class; and when determining that the Bluetooth transmission link is the second transmission link, the processor adjusts the power control table to the low gain class. According to the solution provided in this embodiment, overflow and excessively low power caused by excessively high Bluetooth transmit power can be effectively prevented by adjusting the power control table.

In a possible case, the Bluetooth device is a secondary Bluetooth device and a receiver of the secondary Bluetooth device receives an RSSI, detected by a primary Bluetooth device, of the secondary Bluetooth device. According to the solution provided in this embodiment, the secondary Bluetooth device does not need to detect the RSSI of the secondary Bluetooth device, thereby simplifying a structure of the secondary Bluetooth device, and reducing costs of the secondary Bluetooth device.

In a possible case, the Bluetooth device is a primary Bluetooth device, the obtaining a received signal strength indicator RSSI is: obtaining, by the primary Bluetooth device, an RSSI of a secondary Bluetooth device, and the determining a Bluetooth transmission link based on a comparison result is: determining, by the primary Bluetooth device, the Bluetooth transmission link based on the comparison result. According to the solution provided in this embodiment, the primary Bluetooth device can adjust transmit power of the primary Bluetooth device based on signal strength of the secondary device.

It can be learned from the foregoing solutions that according to the Bluetooth communication method and the Bluetooth device provided in the embodiments of the present invention, two types of transmission links are configured in the Bluetooth device, the RSSI value of the Bluetooth device is detected, the detected RSSI value is compared with the predetermined value, and the transmission link of the Bluetooth device is determined based on the comparison result. In this way, when it is ensured that transmit power of the Bluetooth device is high enough, power consumption for transmission of the Bluetooth device is reduced. Therefore, the Bluetooth device can work at relatively high transmit power, thereby relatively prolonging working time of the Bluetooth device.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show some embodiments of the present invention, and a person of ordinary skill in the art may derive other drawings from these accompanying drawings without creative efforts.

DESCRIPTION OF EMBODIMENTS

To make the objectives, technical solutions, and advantages of the embodiments of the present invention clearer, the following describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

Figure 1A:
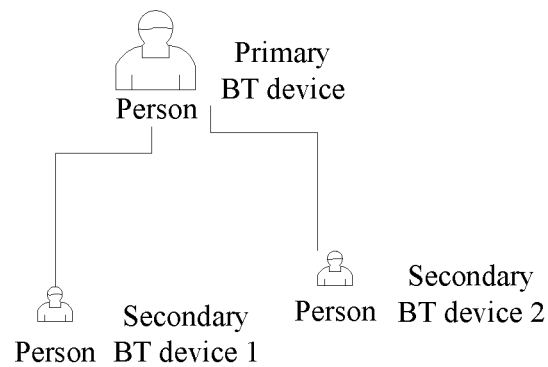
FIG. 1A and FIG. 1B are diagrams of usage scenarios of a Bluetooth device.
Figure 1B:
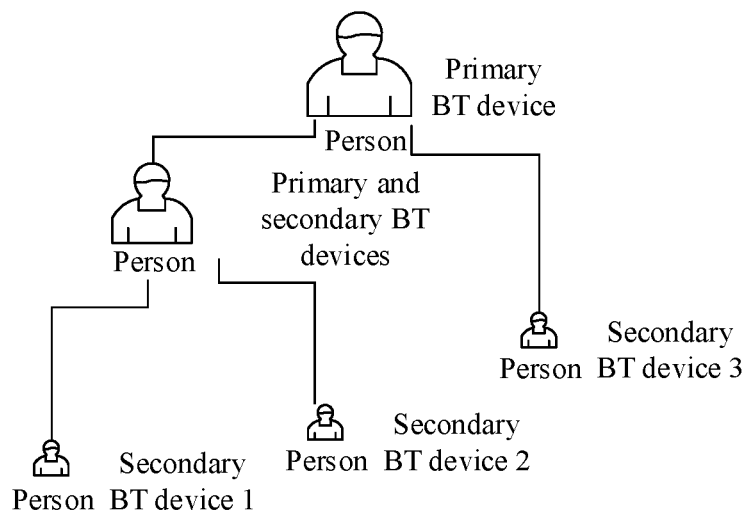
Figure 2:
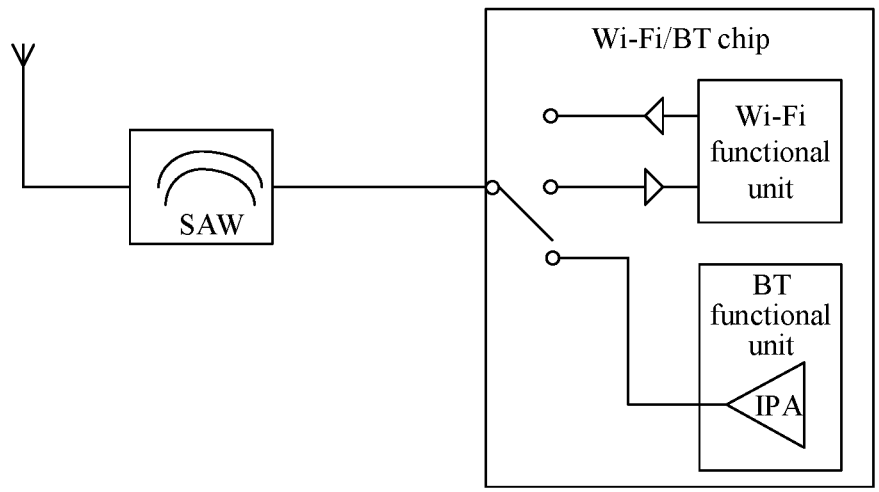
FIG. 2 is a schematic diagram of a Wi-Fi/BT module in the prior art.
Figure 3A:
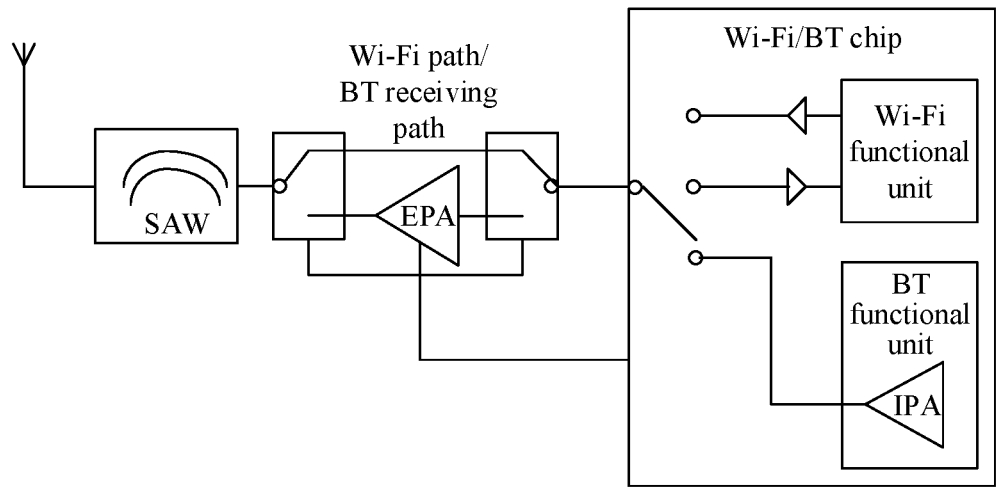
FIG. 3A and FIG. 3B are schematic diagrams of a working status of an external power amplifier of a Bluetooth chip in a technology of the present invention.
Figure 3B:
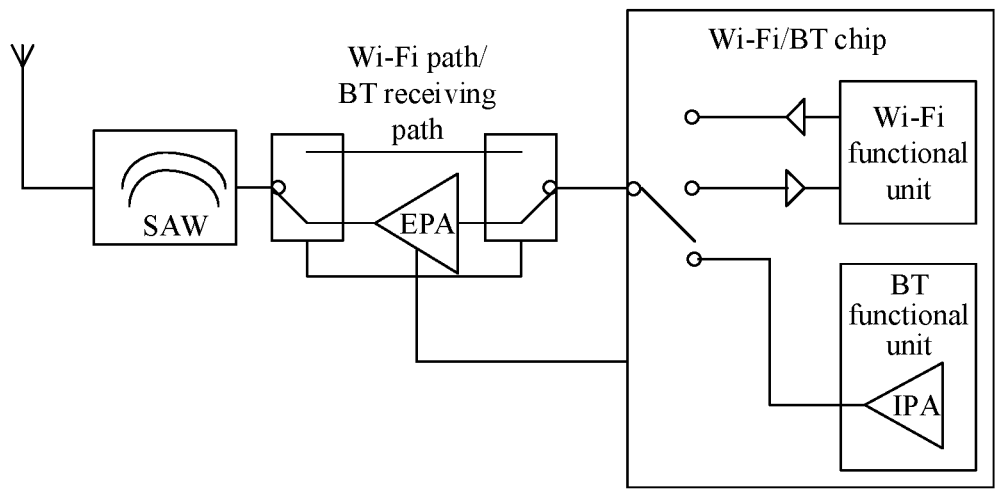
Figure 4:
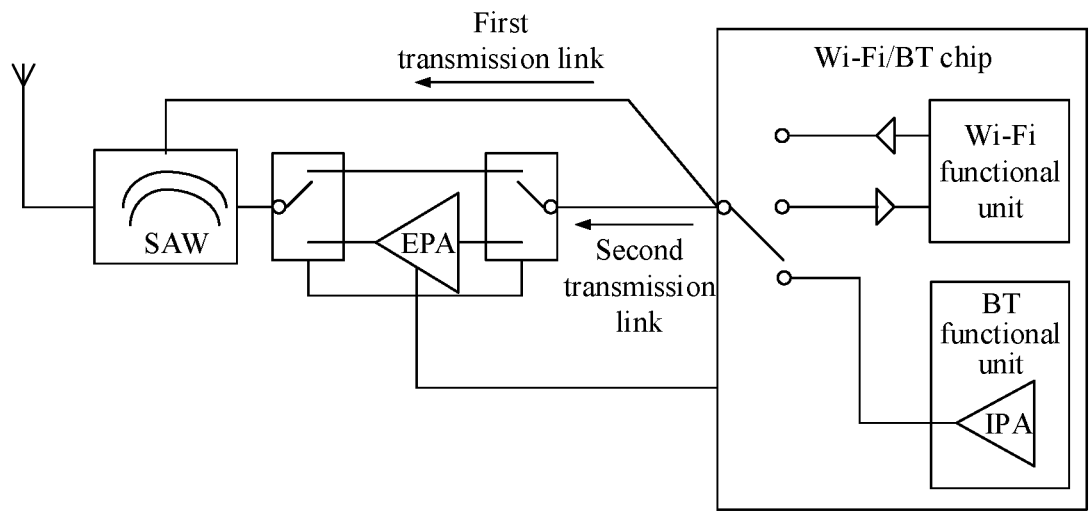
FIG. 4 is a schematic diagram of a Bluetooth device according to an embodiment of the present invention.

To resolve prior-art problems of excessively high power consumption and possibly caused saturation of Bluetooth transmit power resulting from excessively high transmit power of a Bluetooth product in which an external power amplifier is disposed, the embodiments of the present invention propose a solution for adjusting the transmit power of the Bluetooth product. According to the embodiments of the present invention, improvements are made based on schematic structural diagrams of a Bluetooth device shown in FIG. 3A and FIG. 3B. As shown in FIG. 4, a Bluetooth device provides two types of transmission links, so that the Bluetooth device can adjust transmit power based on an actual situation, thereby prolonging working time of the Bluetooth device while ensuring the Bluetooth transmit power.

FIG. 4 is a schematic structural diagram of a Bluetooth device according to an embodiment of the present invention. In this embodiment, two transmission links, namely, a first transmission link and a second transmission link, are configured in the Bluetooth device. It can be learned from the figure that in the first transmission link, Bluetooth transmit power is amplified by an internal power amplifier of a Bluetooth chip, and in the second transmission link, the Bluetooth transmit power is amplified by the internal power amplifier and an external power amplifier of the Bluetooth chip.

Figure 5:
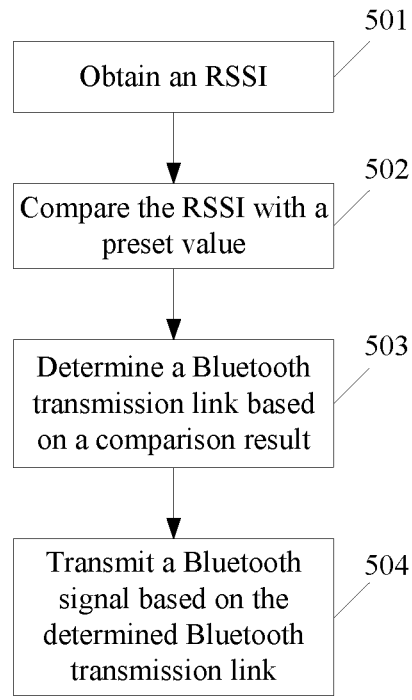
FIG. 5 is a flowchart of a communication method for a Bluetooth device according to an embodiment of the present invention.
Figure 6:
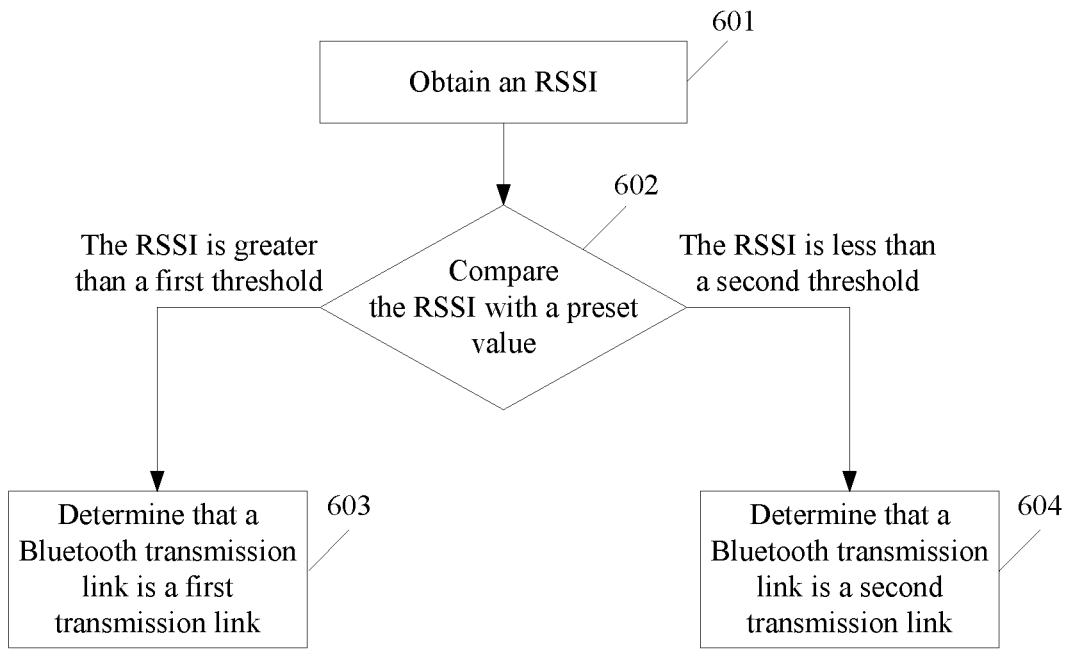
FIG. 6 is a flowchart of another communication method for a Bluetooth device according to an embodiment of the present invention.
Figure 7:
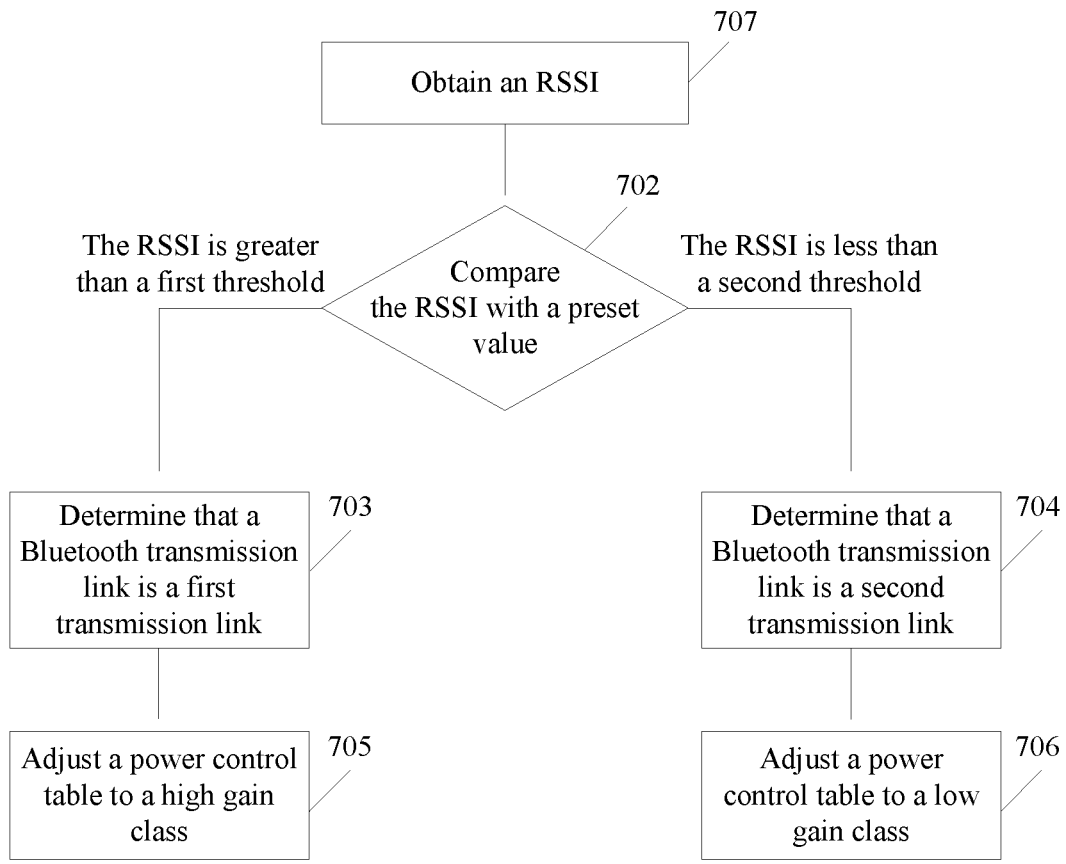
FIG. 7 is a flowchart of another communication method for a Bluetooth device according to an embodiment of the present invention.

With reference to FIG. 5 to FIG. 7, the following describes in detail a communication method for a Bluetooth device according to embodiments of the present invention.

FIG. 5 shows a communication method for a Bluetooth device according to an embodiment of the present invention.

Step 501: A Bluetooth device obtains a received signal strength indicator RSSI.

Step 502: Compare the obtained RSSI with a preset value.

The preset value is determined based on an actual requirement of a product. In actual implementation, the preset value is also related to antenna quality. A possible case is that there are two preset values, namely, a first threshold and a second threshold. For example, the preset values are −70 and −65.

Step 503: Determine a Bluetooth transmission link based on a comparison result.

The Bluetooth transmission link includes a first transmission link and a second transmission link. As shown in FIG. 4, the first transmission link is a transmission link of an internal power amplifier of a Bluetooth module, and the second transmission link is a transmission link of a combination of the internal power amplifier of the Bluetooth module and an external power amplifier of the Bluetooth module. Generally, when the obtained RSSI value is relatively small, for example, less than the first threshold, it indicates that a Bluetooth signal is relatively poor in this case, and Bluetooth transmit power needs to be adjusted to a relatively large value. Transmit power of a second transmission link is relatively high, so that in this case, it is determined that the Bluetooth transmission link is the second transmission link; otherwise, when the obtained RSSI value is relatively large, for example, greater than the first threshold, it indicates that a Bluetooth signal is relatively strong in this case, relatively high transmit power is not needed, and in this case, it is determined that the Bluetooth transmission link is the first transmission link, in other words, the transmission link of the internal power amplifier of the Bluetooth module.

Step 504: Transmit a Bluetooth signal based on the determined Bluetooth transmission link.

According to the Bluetooth communication method provided in the foregoing embodiment, two types of transmission links are provided in the Bluetooth device, so that the Bluetooth device can adjust transmit power based on an actual situation, thereby prolonging working time of the Bluetooth device while ensuring the Bluetooth transmit power.

FIG. 6 shows a communication method for a Bluetooth device according to an embodiment of the present invention.

Step 601: A Bluetooth device obtains a received signal strength indicator RSSI.

Step 602: Compare the obtained RSSI with a preset value; and if the RSSI is greater than a first threshold, perform step 603; or if the RSSI is less than a second threshold, perform step 604.

Step 603: Determine that a Bluetooth transmission link is a first transmission link; and the Bluetooth device transmits a Bluetooth signal through the first transmission link.

Step 604: Determine that a Bluetooth transmission link is a second transmission link; and the Bluetooth device transmits a Bluetooth signal through the second transmission link.

According to the Bluetooth communication method provided in the foregoing embodiment, two types of transmission links are provided in the Bluetooth device, so that the Bluetooth device can adjust transmit power based on an actual situation, thereby prolonging working time of the Bluetooth device while ensuring the Bluetooth transmit power.

FIG. 7 shows a communication method for a Bluetooth device according to an embodiment of the present invention. In this embodiment, a Bluetooth power control table is used. The Bluetooth power control table records a relationship between a Bluetooth power class and output power, and is used for controlling Bluetooth output power.

Step 701: A Bluetooth device obtains a received signal strength indicator RSSI.

Step 702: Compare the obtained RSSI with a preset value; and if the RSSI is greater than a first threshold, perform step 703; or if the RSSI is less than a second threshold, perform step 704.

The Bluetooth transmission link includes a first transmission link and a second transmission link. As shown in FIG. 4, the first transmission link is a transmission link of an internal power amplifier of a Bluetooth module, and the second transmission link is a transmission link of a combination of the internal power amplifier of the Bluetooth module and an external power amplifier of the Bluetooth module. Generally, when the obtained RSSI value is relatively small, for example, less than the first threshold, it indicates that a Bluetooth signal is relatively poor in this case, and Bluetooth transmit power needs to be adjusted to a relatively large value. Transmit power of a second transmission link is relatively high, so that in this case, it is determined that the Bluetooth transmission link is the second transmission link; otherwise, when the obtained RSSI value is relatively large, for example, greater than the first threshold, it indicates that a Bluetooth signal is relatively strong in this case, relatively high transmit power is not needed, and in this case, it is determined that the Bluetooth transmission link is the first transmission link, in other words, the transmission link of the internal power amplifier of the Bluetooth module.

Step 703: Determine that a Bluetooth transmission link is a first transmission link; and the Bluetooth device transmits a Bluetooth signal through the first transmission link. After it is determined that the Bluetooth transmission link is the first transmission link, the method further includes step 705, that is, adjust a power control table of a Bluetooth chip to a high gain class.

In the prior art, for example, a Bluetooth power control table may be Table 1.

TABLE 1

| Gain class | Output power of an IPA | Total output |
| --- | --- | --- |
| 0 | −6 | −6 |
| 1 | −4 | −4 |
| 2 | −2 | −2 |
| 3 | 0 | 0 |
| 4 | 2 | 2 |
| 5 | 4 | 4 |
| 6 | 6 | 6 |

Alternatively, a Bluetooth power control table may be Table 2.

TABLE 2

| Gain class | Output power of a combination of an IPA and an EPA | Total output |
| --- | --- | --- |
| 0 | 16 | 16 |
| 1 | 18 | 18 |
| 2 | 20 | 20 |
| 3 | 22 | 22 |
| 4 | 24 | 24 |
| 5 | 26 | 26 |
| 6 | 28 | 28 |

It can be learned from the foregoing tables that output power of a combination of the IPA and the EPA is higher; a higher gain class indicates higher output power, and output power of a Bluetooth device is more likely to be saturated, resulting in a product transmission indicator exception and affecting communication quality.

In this embodiment of the present invention, improvements are made in the foregoing Bluetooth control table. An example of an improved Bluetooth control table may be as follows:

TABLE 3

| Gain class | Output power of an IPA | Output power of a combination of the IPA and an EPA | Total output |
| --- | --- | --- | --- |
| 0 | −10 | 12 | 12 |
| 1 | −8 | 14 | 14 |
| 2 | −6 | | −6 |
| 3 | −4 | | −4 |
| 4 | −2 | | −2 |
| 5 | 0 | | 0 |
| 6 | 2 | | 2 |
| 7 | 4 | | 4 |
| 8 | 6 | | 6 |

It can be learned from Table 3 that two output classes are added in this table. In the original two lowest output classes 0 and 1, the output power of the IPA is also relatively low.

In this embodiment, after it is determined that the Bluetooth transmission link is the first transmission link, the power control table of the Bluetooth chip is adjusted to a high gain class, for example, the high gain class may be a class of 2 or higher. In this case, the output power of the IPA is relatively high, thereby ensuring communication quality of the Bluetooth device and a relatively low power consumption of the Bluetooth device.

Step 704: Determine that the Bluetooth transmission link is the second transmission link; and the Bluetooth device transmits a Bluetooth signal through the second transmission link. After it is determined that the Bluetooth transmission link is the second transmission link, the method further includes step 706: adjust the power control table of the Bluetooth chip to a low gain class.

As shown in Table 3, after it is determined that the Bluetooth transmission link is the first transmission link, the power control table of the Bluetooth chip is adjusted to a low gain class. For example, the low gain class may be class 0 or class 1. In this case, output power of a combination of the IPA and the EPA is relatively high. This avoids a transmission indicator exception caused by saturated output power of the Bluetooth device, thereby not affecting communication quality.

According to the Bluetooth communication method provided in the foregoing embodiment, two types of transmission links are provided and the power control table of the Bluetooth device is improved, so that the Bluetooth device can adjust the transmit power based on an actual situation, thereby prolonging working time of the Bluetooth device while ensuring the Bluetooth transmit power.

Figure 8:
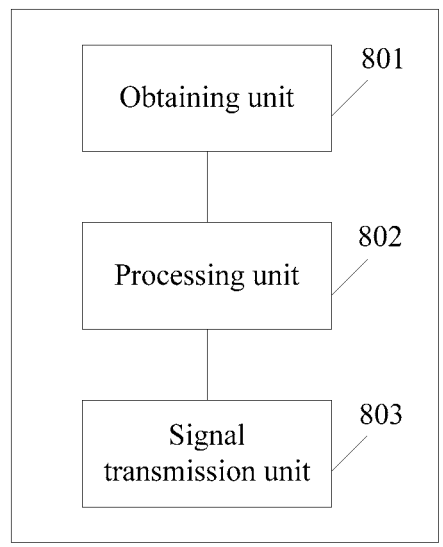
FIG. 8 is a schematic diagram of a Bluetooth device according to an embodiment of the present invention.

FIG. 8 is a schematic structural diagram of a Bluetooth device according to an embodiment of the present invention. The Bluetooth device includes an obtaining unit 801, a processing unit 802, and a signal transmission unit 803. The obtaining unit 801 is configured to obtain a received signal strength indicator RSSI. The processing unit 802 is configured to compare the obtained RSSI with a predetermined value, and determine a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module. The signal transmission unit 803 is configured to transmit a Bluetooth signal based on the Bluetooth transmission link determined by the processing unit. The Bluetooth device provided in this embodiment is used for processing the communication method described in the foregoing method embodiments. For a detailed processing procedure, refer to descriptions of the foregoing method embodiments, and details are not described herein again. According to the Bluetooth device provided in this embodiment of the present invention, transmit power may be adjusted based on an actual situation, thereby prolonging working time of the Bluetooth device while ensuring the Bluetooth transmit power.

Figure 9:
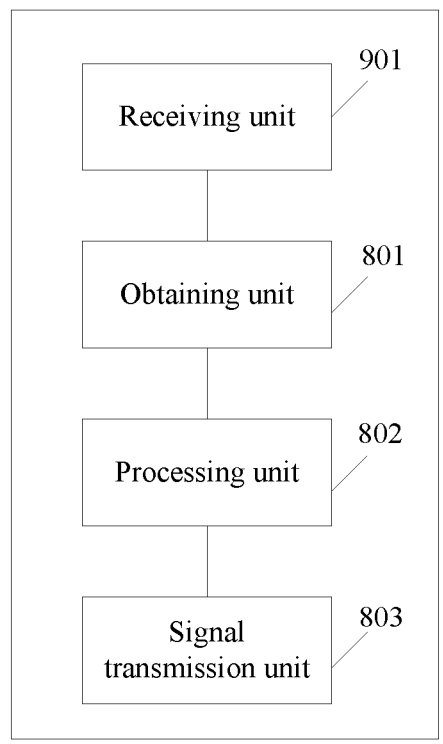
FIG. 9 is a schematic diagram of another Bluetooth device according to an embodiment of the present invention.

FIG. 9 is schematic structural diagram of another Bluetooth device according to an embodiment of the present invention. The Bluetooth device is a secondary Bluetooth device. The secondary Bluetooth device includes a receiving unit 901, an obtaining unit 801, a processing unit 802, and a signal transmission unit 803. The receiving unit 901 is configured to receive, from a primary Bluetooth device, an RSSI, detected by the primary Bluetooth device, of the secondary Bluetooth device. The obtaining unit 801 is configured to obtain a received signal strength indicator RSSI. The processing unit 802 is configured to compare the obtained RSSI with a predetermined value, and determine a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module. The signal transmission unit 803 is configured to transmit a Bluetooth signal based on the Bluetooth transmission link determined by the processing unit. The Bluetooth device provided in this embodiment is used for processing the communication method described in the foregoing method embodiments. For a detailed processing procedure, refer to descriptions of the foregoing method embodiments, and details are not described herein again. According to the Bluetooth device provided in this embodiment of the present invention, transmit power may be adjusted based on an actual situation, thereby prolonging working time of the Bluetooth device while ensuring the Bluetooth transmit power.

Figure 10:
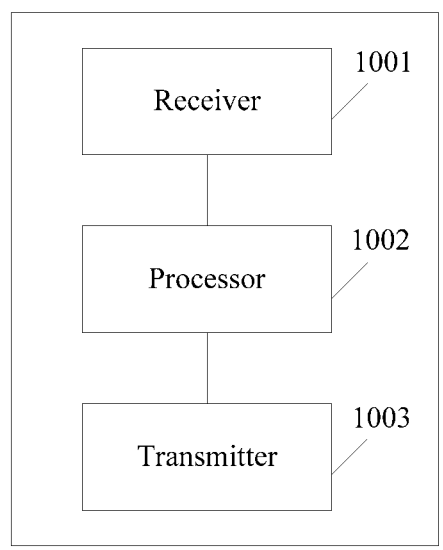
FIG. 10 is a schematic diagram of another Bluetooth device according to an embodiment of the present invention.

FIG. 10 is a schematic structural diagram of a Bluetooth device according to an embodiment of the present invention. The Bluetooth device includes a receiver 1001, a processor 1002, and a signal transmitter 1003. The receiver 1001 is configured to obtain a received signal strength indicator RSSI. The processor 1002 is configured to compare the obtained RSSI with a predetermined value, and determine a Bluetooth transmission link based on a comparison result, where the Bluetooth transmission link includes a first transmission link and a second transmission link, where the first transmission link is a transmission link of an internal power amplifier of a Bluetooth module, and the second transmission link is a transmission link of a combination of the internal power amplifier of the Bluetooth module and an external power amplifier of the Bluetooth module. The signal transmitter 1003 is configured to transmit a Bluetooth signal based on the Bluetooth transmission link determined by the processing unit. When the Bluetooth device is a secondary Bluetooth device, the receiver 1001 is further configured to receive, from a primary Bluetooth device, an RSSI, detected by the primary Bluetooth device, of the secondary Bluetooth device. The Bluetooth device provided in this embodiment is used for processing the communication method described in the foregoing method embodiments. For a detailed processing procedure, refer to descriptions of the foregoing method embodiments, and details are not described herein again. According to the Bluetooth device provided in this embodiment of the present invention, transmit power may be adjusted based on an actual situation, thereby prolonging working time of the Bluetooth device while ensuring the Bluetooth transmit power.

According to the embodiment of the present invention, a person skilled in the art can make various modifications and variations to the present invention without departing from the spirit and scope of the present invention. The present invention is intended to cover these modifications and variations provided that they fall within the scope of protection defined by the following claims and their equivalent technologies.

Finally, it should be noted that the foregoing embodiments are merely intended for describing the technical solutions of the present invention, but not for limiting the present invention. Although the present invention is described in detail with reference to the foregoing embodiments, a person of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A system, comprising:
   a primary device, and
   a secondary device including a Bluetooth chip, a first power amplifier disposed inside the Bluetooth chip and a second power amplifier disposed outside the Bluetooth chip, the secondary device being connected with the primary device via a Bluetooth connection,
   wherein the secondary device is configured to
      obtain a first received signal strength indicator (RSSI) sent by the primary device;
      when the first RSSI is less than a first threshold, switch on a second power amplifier, the secondary device being connected with the primary device via the Bluetooth connection based on the first power amplifier and the second power amplifier;
      obtain a second RSSI sent by the primary device;
      when the second RSSI is greater than a second threshold, switch off the second power amplifier, the secondary device being connected with the primary device via the Bluetooth connection based on the first power amplifier,
   wherein the secondary device comprises a power control table comprising a high gain class indicating a high output power of the first power amplifier and a low gain class indicating a low output power of the first power amplifier, wherein
      when the first RSSI is less than the first threshold, the power control table is adjusted to the low gain class; and when the second RSSI is greater than the second threshold, the power control table is adjusted to the high gain class.

2. The system according to claim 1, wherein when the first RSSI is less than a first threshold, Bluetooth transmit power of the secondary device is amplified by the first power amplifier and the second power amplifier.

3. The system according to claim 2, wherein when the second RSSI is greater than a second threshold, the Bluetooth transmit power of the secondary device is amplified by the first power amplifier.

4. The system according to claim 1, wherein the first threshold is a first predetermined value, the second threshold is a second predetermined value, the first predetermined value is different with the second predetermined value.

5. A method, comprising:
   obtaining, by a secondary device, a first received signal strength indicator (RSSI) from a primary device, wherein the secondary device includes a Bluetooth chip, a first power amplifier disposed inside the Bluetooth chip and a second power amplifier disposed outside the Bluetooth chip;
   when the first RSSI is less than a first threshold, switching on, by the secondary device, a second power amplifier, the secondary device being connected with the primary device via the a Bluetooth connection based on a first power amplifier and the second power amplifier;
   obtaining, by a secondary device, a second RSSI from the primary device;
   when the second RSSI is greater than a second threshold, switch off, by secondary device, the second power amplifier, the secondary device being connected with the primary device via the Bluetooth connection based on the first power amplifier,
   wherein the secondary device comprises a power control table comprising a high gain class indicating a high output power of the first power amplifier and a low gain class indicating a low output power of the first power amplifier, wherein
      when the first RSSI is less than the first threshold, the power control table is adjusted to the low gain class; and when the second RSSI is greater than the second threshold, the power control table is adjusted to the high gain class.

6. The method according to claim 5, wherein when the first RSSI is less than a first threshold, Bluetooth transmit power of the secondary device is amplified by the internal power amplifier and an external power amplifier.

7. The method according to claim 6, wherein when the second RSSI is greater than a second threshold, the Bluetooth transmit power of the secondary device is amplified by an internal power amplifier.

8. The method according to claim 5, wherein the first threshold is a first predetermined value, the second threshold is a second predetermined value, the first predetermined value is different with the second predetermined value.

* * * * *